(12) United States Patent
Suehiro et al.

(10) Patent No.: US 7,453,092 B2
(45) Date of Patent: Nov. 18, 2008

(54) LIGHT EMITTING DEVICE AND LIGHT EMITTING ELEMENT HAVING PREDETERMINED OPTICAL FORM

(75) Inventors: Yoshinobu Suehiro, Aichi-ken (JP); Koji Tasumi, Aichi-ken (JP)

(73) Assignee: Toyoda Gosei Co., Ltd., Nishikasugai-gun, Aichi-ken (JP)

( * ) Notice: Subject to any disclaimer, the term of this patent is extended or adjusted under 35 U.S.C. 154(b) by 97 days.

(21) Appl. No.: 11/214,018

(22) Filed: Aug. 30, 2005

(65) Prior Publication Data

US 2006/0043402 A1    Mar. 2, 2006

(30) Foreign Application Priority Data

Aug. 31, 2004   (JP)   .............................. 2004-253447
Jul. 13, 2005   (JP)   .............................. 2005-204983

(51) Int. Cl.
*H01L 33/00* (2006.01)

(52) U.S. Cl. .............................. 257/79; 257/13; 257/80; 257/82; 257/93; 257/103; 257/777; 257/E51.018; 257/E51.022; 257/E33.001; 257/E33.054

(58) Field of Classification Search ................ 257/13, 257/79, 80, 82, 93, 99, 103, 777
See application file for complete search history.

(56) References Cited

U.S. PATENT DOCUMENTS

| | | | | |
|---|---|---|---|---|
| 5,618,872 A | * | 4/1997 | Pohl et al. ................... | 524/430 |
| 5,742,120 A | * | 4/1998 | Lin ............................. | 313/512 |
| 5,779,924 A | * | 7/1998 | Krames et al. ................ | 216/24 |
| 6,291,839 B1 | * | 9/2001 | Lester ........................... | 257/91 |
| 6,420,735 B2 | * | 7/2002 | Kim ............................. | 257/95 |
| 6,426,519 B1 | * | 7/2002 | Asai et al. .................... | 257/103 |
| 6,504,180 B1 | * | 1/2003 | Heremans et al. ............. | 257/98 |
| 6,518,600 B1 | * | 2/2003 | Shaddock ..................... | 257/98 |
| 6,614,172 B2 | * | 9/2003 | Chiu et al. ................... | 313/501 |
| 6,642,072 B2 | * | 11/2003 | Inoue et al. ................... | 438/26 |
| 6,821,804 B2 | * | 11/2004 | Thibeault et al. .............. | 438/29 |
| 6,900,473 B2 | * | 5/2005 | Yoshitake et al. ............. | 257/95 |
| 6,946,788 B2 | * | 9/2005 | Suehiro et al. ............. | 313/498 |
| 2002/0179045 A1 | * | 12/2002 | Matsuda ..................... | 123/311 |

(Continued)

FOREIGN PATENT DOCUMENTS

DE       197 09 228 A1    9/1997

(Continued)

OTHER PUBLICATIONS

Chinese Office Aciton dated Mar. 7, 2008 with English translation.

*Primary Examiner*—Wai-Sing Louiw
*Assistant Examiner*—Marc Armand
(74) *Attorney, Agent, or Firm*—McGinn IP Law Group, PLLC

(57) ABSTRACT

A light emitting device having: a predetermined optical form that is provided on a surface of an LED element mounted on a base, the predetermined optical form being made to allow an increase in efficiency of taken out light from an inside of the LED element; and a sealing material that seals the predetermined optical form. The sealing material has a refractive index of 1.6 or more, the predetermined optical form is formed in a surface of a substrate of the LED element, and the substrate has a refractive index nearly equal to that of a light emitting layer of the LED element.

35 Claims, 14 Drawing Sheets

U.S. PATENT DOCUMENTS

| | | |
|---|---|---|
| 2003/0189830 A1 | 10/2003 | Sugimuto et al. |
| 2004/0079957 A1 | 4/2004 | Andrews et al. |
| 2007/0181895 A1 * | 8/2007 | Nagai .......................... 257/98 |

FOREIGN PATENT DOCUMENTS

| | | |
|---|---|---|
| DE | 199 11 717 A1 | 9/2000 |
| DE | 199 47 030 A1 | 4/2001 |
| DE | 100 20 464 A1 | 11/2001 |
| DE | 202 20 258 U1 | 9/2002 |
| DE | 102 34 977 A1 | 2/2004 |
| DE | 102 45 628 A1 | 4/2004 |
| EP | 1 603 170 A1 | 12/2005 |
| JP | 2003-69075 | 3/2003 |
| WO | WO 02/41406 A1 | 5/2002 |

* cited by examiner

LIGHT EMITTING DEVICE AND LIGHT EMITTING ELEMENT HAVING PREDETERMINED OPTICAL FORM

The present application is based on Japanese patent application Nos. 2004-253447 and 2005-204983, the entire contents of which are incorporated herein by reference.

BACKGROUND OF THE INVENTION

1. Field of the Invention

The present invention relates to a light emitting device and a light emitting element, and in particular, to a light emitting device from which light that has been emitted from a light emitting element can be efficiently taken out, and a light emitting element.

2. Description of the Related Art

A conventional method for manufacturing an LED (light emitting diode) element by growing a semiconductor crystal made of a group III nitride based compound semiconductor on a base substrate, such as sapphire, is known A problem arises in such an LED element, where light that has been generated in a light emitting layer is confined in a layer having a high optical absorption coefficient or absorbed within the layer, and thereby, the efficiency of radiation to the outside is lowered.

In order to solve this problem, unevenness is provided to the surface of some types of LED elements, so as to increase the efficiency of taking out light (see, for example, Japanese Patent Application Laid-Open No. 2003-69073 (FIG. 1, [0011])).

In the LED element that is described in Japanese Patent Application Laid-Open No. 2003-69075 (FIG. 1, [0011]) a gallium nitride based compound semiconductor layer (hereinafter referred to as GaN based semiconductor layer) is layered on a sapphire substrate so as to form a GaN substrate, and subsequently, other GaN based semiconductor layers are layered sequentially on top of this. The sapphire substrate is removed from this layered body, and etching is carried out on the rear surface (surface opposite to the surface on which the element is layered) of the GaN substrate, and thereby, a pit in step form is formed.

In the LED element that is described in Japanese Patent Application Laid-Open No. 2003-69075 (FIG. 1, [0011]), the rear surface of the GaN substrate has a specific form where a pit in step form has been created, and therefore, light can be effectively taken to the outside, by preventing light interference caused by multiple reflection within the GaN based semiconductor layers.

In the LED element that is described in Japanese Patent Application Laid-Open No. 2003-69075 (FIG. 1, [0011]), however, ability to take out light that has been confined within a GaN based semiconductor layer (light confined within a layer) depend on a difference in the refractive index vis-á-vis the sealing member around the element, and a sufficient ability to take out light cannot be gained in a state where a reflection from the interface occurs on the basis of the difference in the refractive index vis-á-vis the sealing member, even in the case where unevenness processing has been carried out on the surface of the element. In addition, though an increase in the efficiency of taking out light car be achieved by scattering light that has been confined within a GaN based semiconductor layer, this is not an ideal form or anything close to this. A problem also arises concerning this light that is confined within a layer, where the amount of light is reduced when it propagates over a long distance within a layer having a large optical absorption coefficient so as to attenuate, and in addition, the amount of generated heat increases within the element.

Accordingly, an object of the present invention is to provide a light emitting device from which light that has been emitted from a light emitting element can be efficiently taken out, and a light emitting element.

SUMMARY OF THE INVENTION

It is an object of the invention to provide a light emitting device, wherein a predetermined optical form for making an increase in the efficiency of taking out light from the inside of an LED element possible is provided to a surface of the LED element that is mounted on a base, which is sealed in a sealing material of which the refractive index is no less than 1.6, and the above described predetermined optical form is formed in a substrate having an refractive index that is approximately the same as that of the light emitting layer of the above described LED element.

(1) According to one aspect of the invention, a light emitting device comprises:

a predetermined optical form that is provided on a surface of an LED element mounted on a base, the predetermined optical form being made to allow an increase in efficiency of taken out light from an inside of the LED element; and a sealing material that seals the predetermined optical form, wherein the sealing material has a refractive index of 1.6 or more, the predetermined optical form is formed in a surface of a substrate of the LED element, and the substrate has a refractive index nearly equal to that of a light emitting layer of the LED element.

(2) According to another aspect of the invention, a light emitting device comprises:

a predetermined optical form that is provided on a surface of an LED element mounted on a base, the predetermined optical form being made to allow an increase in efficiency of taken out light from an inside of the LED element; and a sealing material that seals the predetermined optical form, wherein the sealing material has a refractive index of 1.6 or more, the predetermined optical form is formed in a surface of a semiconductor layer that is exposed by peeling a substrate of the LED element.

(3) According to another aspect of the invention, a light emitting element comprises:

a semiconductor layer that comprises a light emitting layer, a predetermined optical form that is provided on one surface of the semiconductor layer, the predetermined optical form being made to allow an increase in efficiency of taken out light from an inside of the LED element, and an electrode part that is provided on the other surface of semiconductor layer, wherein the predetermined optical form is an uneven surface having a step form of which the angle of inclination is no greater than $\sin^{-1}(n2/n1)$ (where n1 is the refractive index of the light emitting layer of an LED element, and n2 is the index refraction of the sealing material) relative to the direction of the normal of the light emitting layer.

(4) According to another aspect of the invention, a light emitting element comprises:

a semiconductor layer that comprises a light emitting layer, a predetermined optical form that is provided on one surface of the semiconductor layer, the predetermined optical form being made to allow an increase in efficiency of taken out light from an inside of the LED element, and an electrode part that is provided on the other surface of semiconductor layer; and a light transmitting material layer that is provided on one surface of the semiconductor layer, wherein the predetermined optical form is formed in a surface of the light transmitting material layer.

BRIEF DESCRIPTION OF THE DRAWINGS

FIG. 1A is a vertical cross-sectional view, FIG. 1B is a cross-sectional view showing an enlarged portion of an LED element, and FIG. 1C is a diagram showing an enlarged portion of the surface of the LED element on the side from which light is taken out;

FIG. 5A is a plan view showing the LED element as viewed from the side from which light is taken out, FIG. 5B is a cross-sectional view along line A-A of FIG. 5A, and FIG. 5C is a diagram showing an enlarged portion in uneven form that is formed on the surface from which light is taken out;

FIG. 6A is a plan view showing the LED element as viewed from the side from which light is taken out, FIG. 6B is a cross-sectional view along line B-B of FIG. 6A, and FIG. 6C is a diagram showing an enlarged portion in uneven form that is formed on the surface from which light is taken out;

FIG. 7A is a plan view showing the LED element as viewed from the side from which light is taken out, FIG. 7B is a cross-sectional view along line C-C of FIG. 7A, and FIG. 7C is a diagram showing an enlarged portion in uneven form that is formed on the surface from which light is taken out;

FIG. 8A is a plan view showing the LED element as viewed from the side from which light is taken out, and FIG. 82 is a diagram illustrating how light is taken out from a protrusion of FIG. 8A;

FIG. 9A is a plan view showing the LED element as viewed from the side from which light is taken out, and FIG. 9B is a cross-sectional view along line D-D of FIG. 9A;

FIG. 15A is a vertical cross-sectional view showing an LED lamp, and FIG. 15B is a vertical cross-sectional view of the LED element that is mounted on the LED lamp.

DESCRIPTION OF THE PREFERRED EMBODIMENTS

First Embodiment (Configuration of Light Emitting Device 1)

Figure 1A:
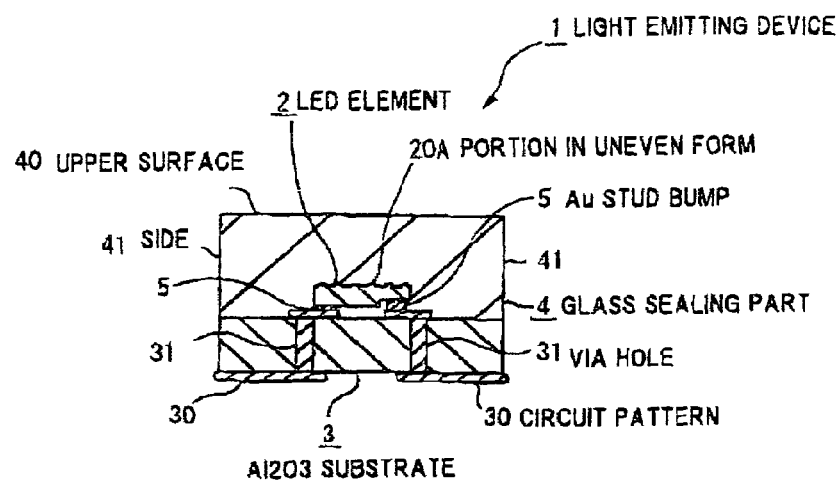
FIGS. 1A to 1C show a light emitting device according to a first embodiment.
Figure 1B:
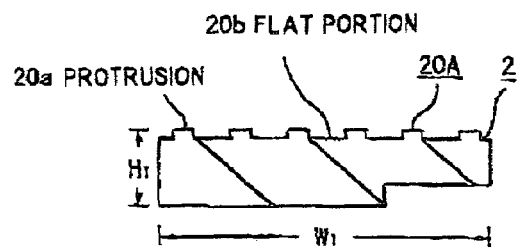
Figure 1C:
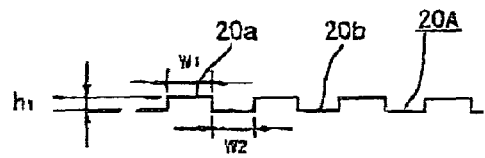

FIGS. 1A to 1C show a light emitting device according to a first embodiment; FIG. 1A is a vertical cross-sectional view, FIG. 1B is a cross-sectional view showing an enlarged portion of the LED element, and FIG. 1C is a diagram showing an enlarged portion of the surface of the LED element on the side from which light is taken out.

As shown in FIG. 1A, this light emitting device 1 is made of a group III nitride based compound semiconductor, and has a flip chip type LED element 2 having a portion in uneven form 20A on the surface on the side from which light is taken out, an $Al_2O_3$ substrate 3, which is an inorganic substrate on which LED element 2 is mounted, a glass sealing part 4 which is made of an inorganic sealing material, and Au stud bumps 5 for electrically connecting the electrodes of LED element 2 to circuit patterns 30 which are formed of tungsten (W) on $Al_2O_3$ substrate 3.

$Al_2O_3$ substrate 3 has via holes 31 in a cross section, and circuit patterns 30 on the two sides of the substrate are electrically connected through conductive parts made of W which are provided in these via holes 31.

Glass sealing part 4 is formed of an $SiO_2$—$Nb_2O_5$ (refractive index n=1-8) based low melt point glass, and has flat sides 41 and a flat upper surface 40 LED element 2 is formed in flat form, as shown in FIG. 1B, and is formed so as to have $W_1$=300 μm and $H_1$=10 μm according to the present embodiment. Here, the wavelength of light that is emitted from this LED element 2 is 460 nm.

In addition, in LED element 2, as shown in FIG. 1C, protrusions 20a ($w_1$=4 μm, $h_1$=2 μm) and flat portions 20b ($w_2$=8 μm) are placed on the surface on the side from which light is taken out, so as to form a portion in uneven form 20A. This portion is referred to as portion in uneven form 20A because adjacent protrusions 20a across a flat portion 20b form a recess.

(Configuration of LED Element 2)

Figure 2:
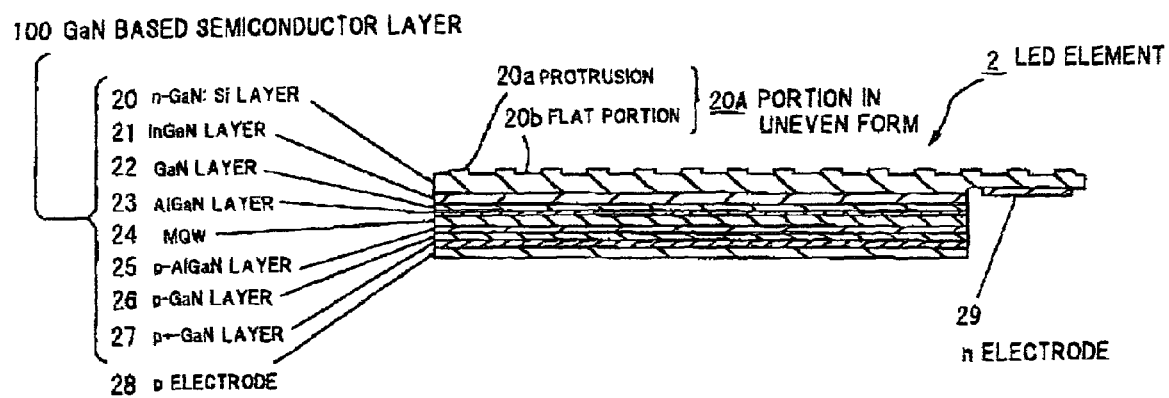
FIG. 2 is a vertical cross-sectional view showing the configuration of the LED element.

FIG. 2 is a vertical cross-sectional view showing the configuration of the LED element. LED element 2 is formed by sequentially layering an n-GaN: Si layer 20, an InGaN layer 21, a GaN layer 22, an AlGaN layer 23, an MQW 24, a p-AlGaN layer 25, a p-GaN layer 26 and a p+-GaN layer 27, as a GaN based semiconductor layer 100 on a sapphire substrate, not shown. In addition, the LED element has a p-electrode 28 on p+-GaN layer 27 and an n electrode 29 on an exposed portion of n-GaN: Si layer 20, where the layers are removed through etching starting from p+-GaN layer 27 up to n-GaN: Si layer 20. Portion in uneven form 20A includes the above described protrusions 20a and flat portions 20b, which are formed on the surface of n-GaN: Si layer 20.

Though the method for forming GaN based semiconductor layer 100 is not particularly limited, it can be formed by means of a well-known metal organic chemical vapor deposition method (MOCVD method), a molecular beam epitaxial growth method (MBE method), a halide based chemical vapor deposition method (HVPE method), a sputtering method, an ion plating method, an electron shower method or the like. Here, the configuration of the LED element may be a homo structure, a hetero structure or a double hetero structure. Furthermore, a quantum well structure (single quantum well structure or multi quantum well structure) may be adopted.

(Manufacturing Process for Light Emitting Device 1)

FIGS. 3A to 3D are diagrams illustrating a manufacturing process for a light emitting device according to the first embodiment. In the following, a process for manufacturing a light emitting device using LED element 2 that has been formed in advance in a separate process is described.

(Mounting Process for LED Element 2)

Figure 3A:
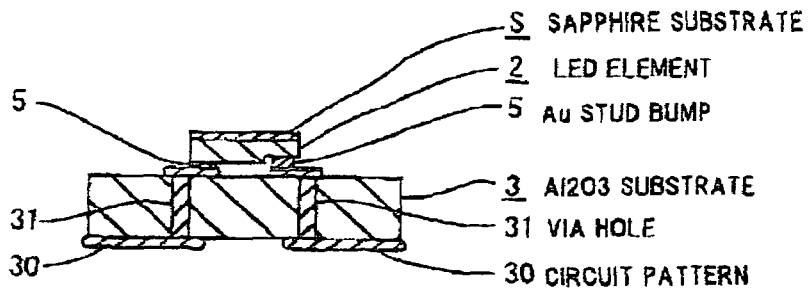
FIGS. 3A to 3D are diagrams illustrating a manufacturing process for a light emitting device according to the first embodiment.

First, as shown in FIG. 3A, LED element 2 and $Al_2O_3$ substrate 3 are prepared and circuit patterns 30 on $Al_2O_3$ substrate 3 and the electrodes on LED element 2 are positioned, so that LED element 2 is electrically connected to circuit patterns 30 via Au stud bumps 5, and at the same time, mounted on $Al_2O_3$ substrate 3. Then, the gap between LED element 2 and $Al_2O_3$ substrate 3 is filled in with a space filling material, not shown. It is preferable for this space filling material to have a small thermal expansion coefficient.

(Peeling Process for Sapphire Substrate S)

Figure 3B:
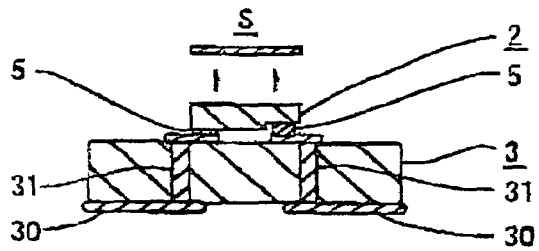
Figure 3C:
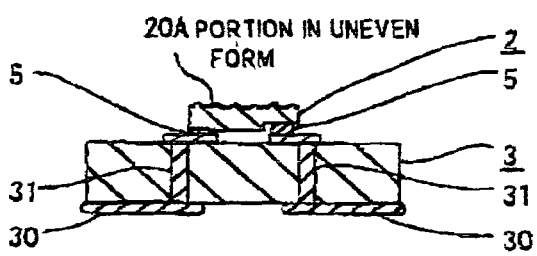
Figure 3D:
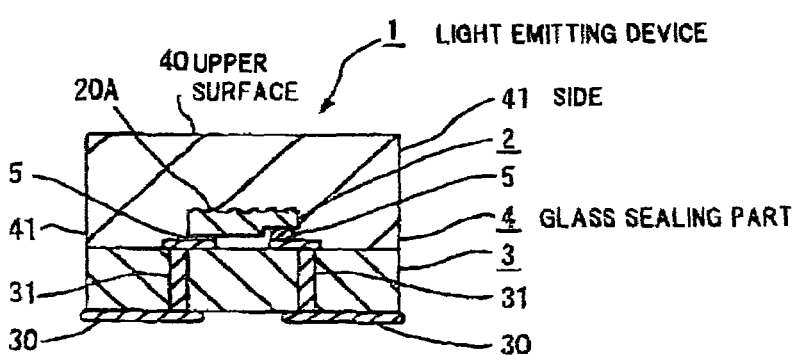

Next, as shown in FIG. 3B, LED element 2 is irradiated with a laser beam on the sapphire substrate S side. The interface between the sapphire substrate and GaN based semiconductor layer 100 is melted through irradiation by the laser beam. As a result of this, sapphire substrate S that is peeled from GaN based semiconductor layer 100 is removed. At this time, residue may remain on the surface of GaN based semiconductor layer 100, and therefore, washing with an acid is carried out, so as to remove the residue, and thereby, n-GaN:Si layer 20 is exposed.

(Forming Process for Portion in Uneven Form 20A)

Next, portion in uneven form 20A is formed on the surface of LED element 2 from which light is taken out, by carrying out unevenness processing, including etching through irradiation by a laser. Unevenness having approximately perpendicular steps is formed is portion in uneven form 20A.

(Glass Sealing Process Using Low Melt Point Glass)

Next, hot press processing is carried out on LED element 2 on which portion in uneven form 20A has been formed, and the gap between LED element 2 and $Al_2O_3$ substrate 3 using an $SiO_2$—$Nb_2O_5$ based glass. As a result of this hot press processing, the glass adheres to the surface of portion in uneven foam 20A In addition, the glass is made to adhere to the surface of $Al_2O_3$ substrate 3, and thereby, the entirety of LED element 2 is sealed in glass. After the glass sealing, the packages are separated into individual pieces through dicing, and thus, light emitting device 1 having upper surface 40 and sides 41 is gained. Here, separation of the packages is also possible through a method for separation such as scribing, in addition to dicing.

(Operation of Light Emitting Device 1)

When circuit patterns 30 which are exposed from the bottom of $Al_2O_3$ substrate 3 of the above described light emitting device 1 are connected to a power supply unit, not shown, so as to energize, a voltage is applied in the forward direction between the n electrode and the p electrode of LED element 2, via the conductive parts of via holes 31, and recombination of carriers, holes and electrons, occurs in MQW 24 of LED element 2, so that light is emitted. Light to be radiated from the surface from which light is taken out from among light that is generated in this light emitting process in MQW 24 enters into glass sealing part 4 from portion in uneven form 20A, transmits through glass sealing part 4, and is radiated to the outside Effects of the First Embodiment The following effects are gained according to the first embodiment.

(1) Sapphire substrate S is removed from LED element 2 that has been mounted on $Al_2O_3$ substrate 3, to which portion in uneven form 20A having an approximately perpendicular step is provided, and thereby, light that is radiated in the direction in which light enters into the sapphire substrate from GaN at an angle that is no greater than the critical angle can be taken to the outside of the element, in the same manner as in a conventional LED element 2, where GaN is formed on a flat sapphire substrate. In addition, light that is radiated in a direction in which the light enters into the sapphire substrate from GaN at an angle that is no smaller than the critical angle and has become light that is confined within a layer inside LED element 2 can also be taken to the outside of the element when the light enters into an uneven portion of portion in uneven form 20A. Light that is radiated to the outside from a flat surface of the uneven surface behaves in the same manner as that which is radiated from an uneven surface where no step is formed, and in addition, light that is confined within a layer is radiated to the outside from a vertical step surface of the uneven surface. Therefore, the amount of light that is radiated upward from the GaN layer can be increased without fail.

In addition, the vertical cross section is not inclined relative to the normal of the light emitting layer of the GaN layer, and therefore, is provided in the direction that makes the solid angle with light confined within a layer maximum, and this is a factor in increasing the effect. In addition, light that has been reflected from the interface in the vertical cross section does not change the size of the angle with the direction of the normal of the light emitting layer.

(2) Furthermore, according to the first embodiment, sapphire substrate S is removed, and instead, $SiO_2$-$Nb_2O_5$ based glass having n=1.8 is used, and thereby, the critical angle θc with LED element 2 becomes approximately 50 degrees. The sealing material may be selected so that critical angle θc between this LED element 2 and glass sealing part 4 becomes no less than 45°, and thereby, the amount of light confined within a layer that propagates laterally through GaN based semiconductor layer 100 can be reduced, in comparison with sapphire substrate S having n =1.7, and furthermore, the probability of light confined within a layer of GaN based semiconductor layer 100 being radiated to the outside of the element when entering into portion in uneven form 20A becomes high. In addition to this, GaN based semiconductor layer 100 has a thickness of 10 μm, and the probability of light being reaching portion in uneven form 20A is high, and therefore, light can be radiated to the outside with extremely high efficiency at an ideal level. In addition, even in the case where the flatness of the uneven surface is not sufficient, due to restriction in processing, the sealing material having a high refractive index compensates for this, and thus, properties which provide an efficiency that is close to the limit of what can be theoretically realized can be achieved. Here, the formation of unevenness is carried out on p-GaN: Si layer 20 which is at a distance from MQW 24 that is the light emitting layer in GaN based semiconductor layer 100, and therefore, damage to the light emitting layer can be avoided at the time of the formation of unevenness. Therefore, the internal quantum efficiency can be maintained, and the efficiency of radiation of light to the outside of LED element 2 can be greatly increased.

(3) LED element 2 is sealed in glass sealing part 4, which is stable against the emitted light wavelength and has excellent light transmitting properties, and thereby, light emitting device 1 of which the properties of taking out light are stable for a long period of time and which has excellent durability is gained, even in the case where high output type LED element 2 which emits a large amount of light is used. In particular, in the case where the internal quantum efficiency is as high as the ideal level, the efficiency of radiation of light to the outside of LED element 2 on flat sapphire substrate S car be increased from 25% to 75%. At this time, heat emission is reduced to no greater than ⅓. In addition, it becomes possible to double the amount of current that is allowed to flow as heat emission decreases, and thereby, the amount of light can be increased as a result of a synergy effect between an increase in the efficiency of LED element 2 and an increase in the amount of current that is allowed to flow. Furthermore, stable light transmitting properties are secured for such radiation of light with high density. In addition, even in the case where the flatness of the uneven surface is not sufficient, due to restriction in processing, the sealing material having a high refractive index compensates for this, and thus, properties which provide an efficiency that is close to the limit of what can be theoretically realized can be achieved. In addition, the device is stable against light having a wavelength of no greater than 470 nm, for example, a wavelength of 365 nm, and thus, can be used to contain an LED element for emitting ultraviolet rays.

In addition, the refractive index of an epoxy resin or a silicon resin, which are currently in general use, is approximately 1.5. However, many existing glass materials provide high transmitting properties, and a high refractive index of no less than 1.6. By using such a glass material, LED element 2 sealed in with a material of a high index refraction can be embodied, and thus, the efficiency of taking out light from LED element 2 can be increased.

(4) In addition, the thermal expansion coefficients of $Al_2O_3$ substrate 3 and glass sealing part 4, which form the package, are approximately the same, and thereby, a structure where inconveniences, such as cracking caused by thermal stress, do not easily occur can be provided. As a result, effects are gained where the value of current that is allowed to flow can be increased, in addition to reliability against thermal impacts. Conventional epoxy resin sealing restricts the current that is allowed to flow, due to the glass transition temperature (Tg point) of the epoxy resin. This is because the thermal expansion coefficient becomes great at a temperature that is no lower than the Tg point, and disconnection easily occurs in electrical connection portions. The Tg point of glass sealing part 4 is higher than that of epoxy resins by 300° C. or more, and the thermal expansion coefficient is no greater than ⅐ of epoxy resins at a temperature that is no higher than the Tg point.

(5) The materials of $Al_2O_3$ substrate 3 and glass sealing part 4 are selected so as to have the same thermal expansion coefficient, and LED element 2 is made so as to be of a flip mounting type where no Au wires are used, and thereby, glass sealing of a highly stable LED element having a high refractive index is implemented. That is to say, glass in a state of high viscosity is processed by applying high pressure, in such a manner that no cracking or peeling is caused by a difference between the temperature for processing and room temperature, and thermal damage caused to LED element 2 can be prevented at the time of processing. In addition, $Al_2O_3$ substrate 3 and glass sealing part 4 chemically combine via an oxide, and therefore, provide high intensity of adhesion. In addition, a flip mounting type LED element 2 is used, making wiring space unnecessary, and thus, it becomes possible to provide a small package.

(6) Circuit patterns are readout to the rear surface of $Al_2O_3$ substrate 3 from the surface on which LED element 2 is mounted, and thereby, the products can be made with excellent productivity. That is to say, a great number of LED elements 2 are mounted on $Al_2O_3$ substrate 3, and glass sealing can be carried out as a collective process using a glass plate.

(7) Sapphire substrate S is peeled after LED element 2 is mounted on $Al_2O_3$ substrate 3, which is a base, and then, portion in uneven form 20A is provided, and therefore, it becomes possible to easily form a package of a variety of sealing materials which are sealing materials other than glass sealing part 4, such as, for example, epoxy resin materials, fluorophore containing light transmitting resin materials and glass materials that contain a fluorophore. In addition, it is also easy to fabricate portion in uneven form 20A of which the uneven form corresponds to the difference in the refractive index vis-à-vis the sealing material.

Here, the above described portion in uneven form 20A for enhancing the properties of taking out light is effective when combined with the configuration for increasing the area of light emission of LED element 2. The area of light emission may be enlarged, for example, by increasing the ratio of the area occupied by the p electrode for supplying a current to GaN based semiconductor layer 100 in the area of the element. In addition, mounting may be carried out using Ag paste or solder plating instead of bumps. At this time, the contact electrodes of GaN semiconductor layer 100 and the external terminal electrodes are separately provided via an insulating layer.

In addition, the p electrode may be formed of ITO (indium tin oxide) having light transmitting properties, and a metal reflecting film. Light confined within a layer that laterally propagates through GaN based semiconductor layer 100 is reflected from ITO, and thereby, it becomes possible to reduce loss caused by metal absorption when light confined within a layer hits the metal reflecting film, and the amount of light that is radiated to the outside from LED element 2 can be increased.

In addition, ITO and $Al_2O_3$ have approximately the same thermal expansion coefficient, and ITO and GaN are made to adhere to each other relatively strongly, and therefore, electrodes can be prevented from peeling due to thermal stress at the time of processing for glass sealing.

Here, though the sealing material is glass in the above description, the sealing material may be glass that is partially crystallized at the time of processing or an inorganic material which is not in a state of glass, and provide the same effects.

Second Embodiment (Configuration of Light Emitting Device 1)

Figure 4:
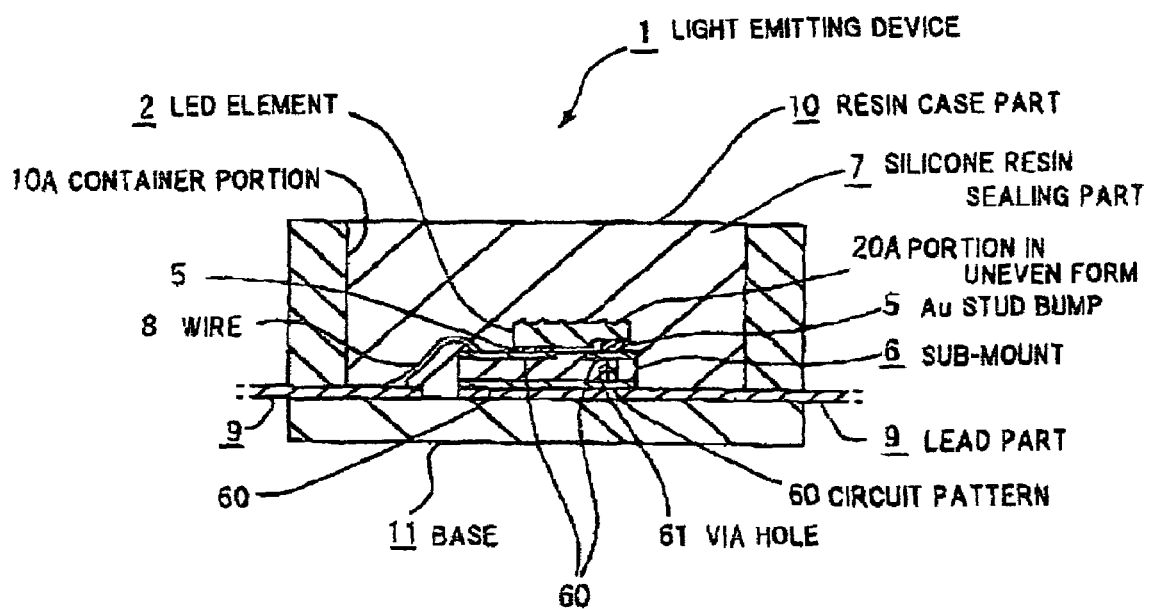
FIG. 4 is a cross-sectional view showing a light emitting device according to a second embodiment.

FIG. 4 is a cross-sectional view showing a light emitting device according to a second embodiment. This light emitting device 1 is a surface mounting type light emitting device 1 using LED element 2 according to the first embodiment, and has a resin case part 10 made of a white resin material, such as nylon, which has a container portion 10A for containing LED element 2, a sub-mount 6 made of AlN for on which LED element 2 is mounted, a silicone resin sealing part 7 for integrally sealing LED element 2 that is contained in container portion 10A of resin case part 10 and sub-mount 6, lead parts 9 for supplying a current to LED element 2 to which sub-mount 6 is secured, and a wire 8 for electrically connecting a lead part 9 to sub-mount 6. Here, in the following description, the same reference numbers are attached to parts that have the same configurations and functions as those in the first embodiment.

LED element 2 is mounted on sub-mount 6 which is a base, and after that, a portion in uneven form 20A is provided by peeling sapphire substrate S, in the same manner as in the first embodiment. Here, the space between LED element 2 and sub-mount 6 is filled in with a space filler, not shown, made of $SiO_2$.

Sub-mount 6 has circuit patterns 60 which are formed of W on the upper surface and the lower surface. Circuit patterns 60 on the upper surface and the lower surface are electrically connected through a conductive part of W which is provided in a via hole 61. In addition, circuit pattern 6 that is connected to the p electrode side of LED element 2 from among circuit patterns 60 is electrically connected to a lead part 9 through wire 8 made of Au.

Silicone resin sealing part 7 has an refractive index of n=1.5, and has functions of sealing LED element 2 and sub-mount 6, and radiating light emitted from LED element 2 to the outside of resin case part 10. Here, silicone resin sealing part 7 may contain a fluorophore that is excited by light that is radiated from LED element 2, and it is also possible to form wavelength converting type light emitting device 1 for emitting light of a predetermined color on the basis of the mixture of light that is radiated from the excited fluorophore and light that is radiated from LED element 2.

Effects of the Second Embodiment

According to the second embodiment, LED element 2 having portion in uneven form 20A on the surface from which light is taken out is sealed in silicone resin sealing part 7, and thereby, surface mounting type light emitting device 1 having a high brightness, where light that laterally propagates through the inside of LED element 2 as light confined within a layer can be efficiently radiated to the outside, can be gained.

Here, $SiO_2$—$Nb_2O_5$ based glass having an refractive index of n=1.8 which is described in the first embodiment may be integrated in layer form through of hot press processing with portion in uneven form 20A of LED element 2 which is described in the second embodiment, and LED element 2 with which this glass is integrated and sub-mount 6 may be sealed in silicone resin sealing part 7. In such a case, light enters into silicone resin sealing part 7 having n=1.5 from LED element 2 having n=2.4, via the glass member having n=1-8, and therefore, the occurrence of total reflection caused by the difference in the refractive index between the materials can be reduced, so that radiation of light emitted from LED element 2 to the outside can be increased.

Third Embodiment (Configuration of LED Element 2)

Figure 5A:
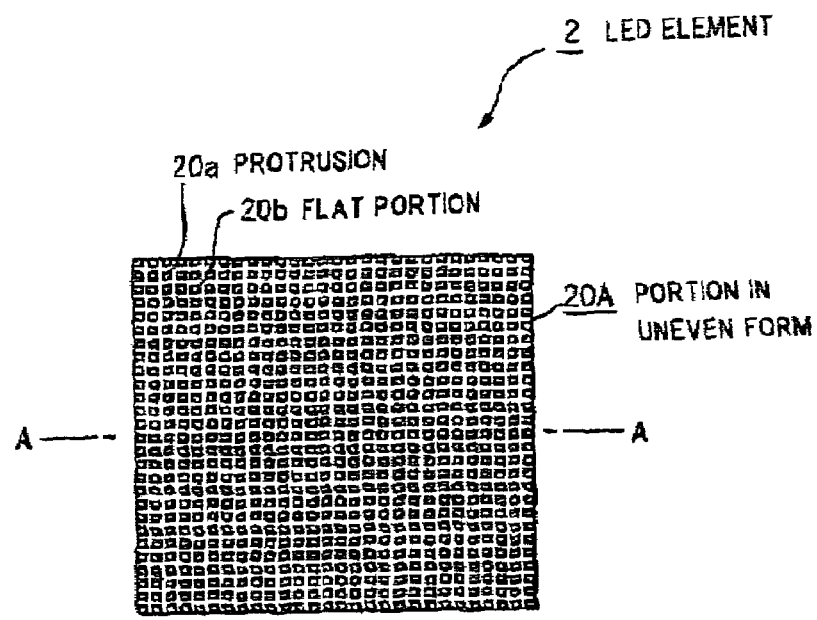
FIGS. 5A to 5C show an LED element according to a third embodiment.
Figure 5B:
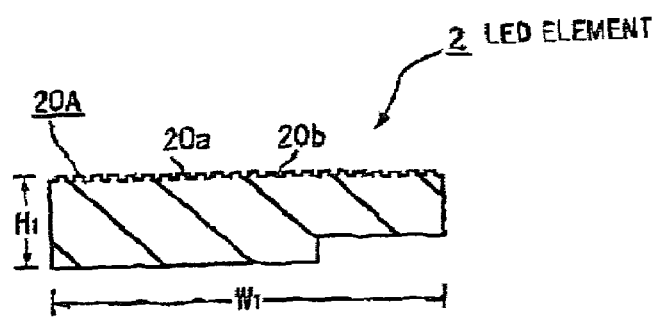
Figure 5C:
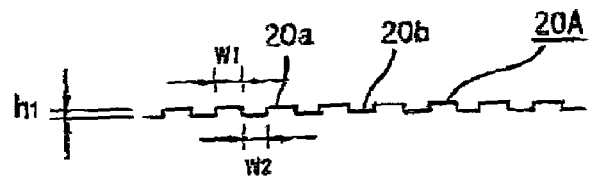

FIGS. 5A to 5C show an LED element according to a third embodiment; FIG. 5A is a plan view of the LED element as viewed from the side from which light is taken out, FIG. 5B is a cross-sectional view along line A-A of FIG. 5A, and FIG. 5C is a diagram showing an enlarged portion in uneven form that is formed on the surface from which light is taken out. In this LED element 2, a portion in uneven form 20A is formed as a microscopic form having protrusions 20a and flat portions 20b with a small pitch, as shown in FIGS. 5A and 5B. LED element 2 has a width $W_1$ of 300 μm, and is formed in square form. Thickness $H_1$ of LED element 2 is 6 μm, and the surface on the side from which light is taken out has portion in uneven form 20A.

Portion in uneven form 20A is formed by arranging protrusions 20a ($w_1$=2 μm, $h_1$=1 μm) and flat portions 20b ($w_2$=2 μm) on the surface on the side from which light is taken out, as shown in FIG. 5C.

Effects of the Third Embodiment

According to the third embodiment, portion in uneven form 20A is provided on the side from which light is taken out of LED element 2 in shallow and microscopic form, and thereby, damage caused to the MQW can be prevented at the time of unevenness processing, and a reliable LED element 2 of which the light emitting properties are stable can be gained. In addition, by making the depth of unevenness shallow, bubbles can be prevented from remaining in the unevenness after the process of sealing portion in uneven form 20A with a sealing material, by applying pressure at the time of the manufacture of the light emitting device. Here, the top surfaces of the protrusions are in square form and have a surrounding trench, and therefore, air easily escapes at the time of pressing.

Fourth Embodiment (Configuration of LED Element 2)

Figure 6A:
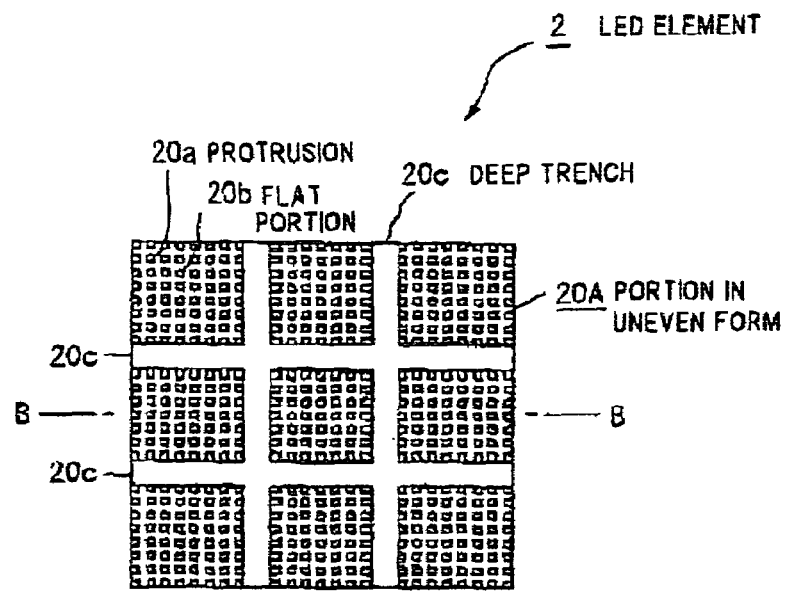
FIGS. 6A to 6C show an LED element according to a fourth embodiment.
Figure 6B:
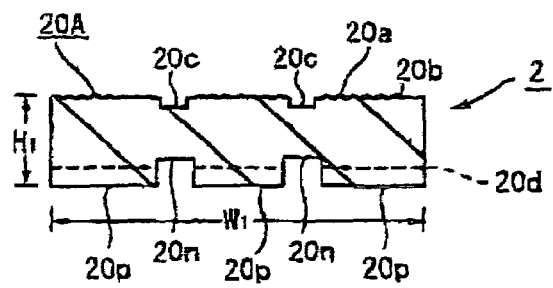
Figure 6C:
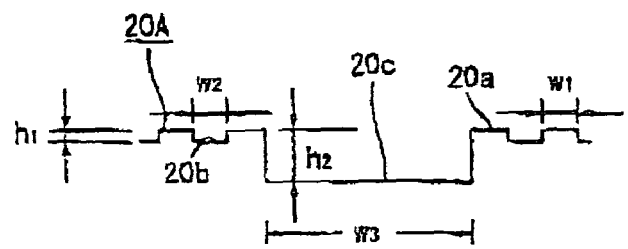

FIGS. 6A to 6C show an LED element according to a fourth embodiment; FIG. 6A is a plan view of the LED element as viewed from the side from which light is taken out, FIG. 6B is a cross-sectional view along line B-B of FIG. 6A, and FIG. 6C is a diagram showing an enlarged portion in uneven form that is formed on the surface from which light is taken out. This LED element 2 is an LED element 2 of a large size, and is formed in rectangular form with a width $W_1$ of 1000 μm, as shown in FIG. 6B. LED element 2 has a thickness $H_1$ of 6 μm and has portion in uneven form 20A on the surface on the side from which light is taken out.

As shown in FIG. 6C, protrusions 20a ($w_1$=2 μm, $h_1$=1 μm) and flat portions 20b ($w_2$=2 μm), and deep trenches 20c ($w_3$=5 μm, $h_2$=4 μm) which divide the region where protrusions 20a and flat portions 20b are formed into nine are arranged on the surface on the side from which light is taken out, and thereby, portion in uneven form 20A is formed.

In addition, LED element 2 has an n electrode 20n which is provided so as to be positioned in the portion where deep trenches 20c are formed, a p electrode 20p which is provided on the surface on the side opposite to portions in uneven form 20A, and an MQW 20d, which is a light emitting layer which emits light by being energized via n electrode 20n and p electrode 20p.

Effects of the Fourth Embodiment

According to the fourth embodiment, the unevenness of portion in uneven form 20A is formed so as to be shallow in portion in uneven form 20A that is provided on the side from which light is taken out from LED element 2, and thereby, MQW 20d can be prevented from being damaged at the time of processing of the unevenness, in the same manner as in the third embodiment, and thus, LED element 2 which emits uniform light can be gained. In addition, by making the depth of unevenness shallow, bubbles can be prevented from remaining in the unevenness after the process of sealing portion in uneven form 20A with a sealing material, by applying pressure at the time of the manufacture of light emitting device 1, and worsening of the sealing properties and dispersion in the optical properties can be prevented.

In addition, by providing deep trenches 20c in portion in uneven form 20A, light that is confined within a layer which laterally propagates through GaN based semiconductor layer 100 of LED element 2 enters into the sides of trenches 20c, and thereby, the light is radiated to the outside. As a result of this, properties of taking out light improve in LED element 2 of a large size. Here, though LED element 2 of a large size is described according to the fourth embodiment, the invention can be applied to LED element 2 of a standard size (square having sides of 300 μm) which is described in the first embodiment.

Furthermore, the regions where p contact electrodes that become a light emitting area are formed have been divided into 9, and as shown in FIG. 6A, each p contact electrode area is surrounded by deep trenches 20c as viewed from the front. As a result of this, light that laterally propagates through GaN based semiconductor layer 100 to the surroundings is radiated from each p contact electrode to the outside of GaN based semiconductor layer 100. The n contact electrode is formed directly beneath deep trenches 20c, where the MQW, which becomes a light emitting layer, does not exist, and therefore, the deep trenches that have been formed do not affect the light emitting layer that exists directly below.

Fifth Embodiment (Configuration of LED Element 2)

Figure 7A:
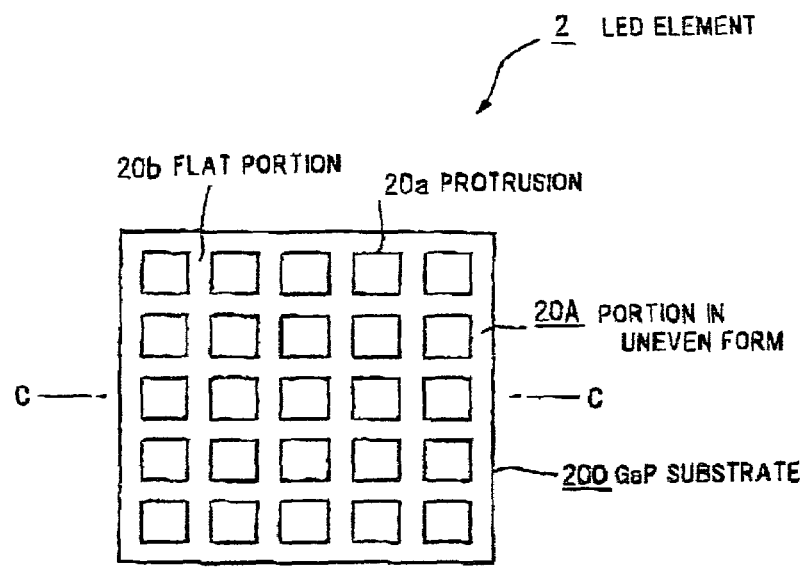
FIGS. 7A to 7C show an LED element according to a fifth embodiment.
Figure 7B:
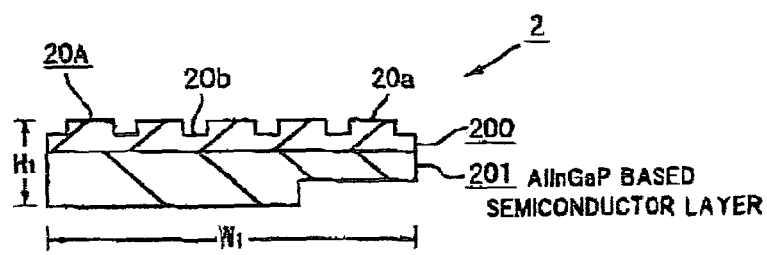
Figure 7C:
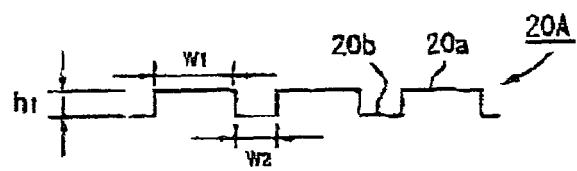

FIGS. 7A to 7C show an LED element according to a fifth embodiment; FIG. 7A is a plan view of the LED element as viewed from the side from which light is taken out, FIG. 7B is a cross-sectional view along line C-C of FIG. 7A, and FIG. 7C is a diagram showing an enlarged portion in uneven form that is formed on the surface from which light is taken out. This LED element 2 is LED element 2 that is formed by layering an AlInGaP based semiconductor layer 201 of which the refractive index is similar to that of a GaAs substrate (n=3.5) on the GaAs substrate, as shown in FIG. 7B and removing the GaAs substrate through polishing, and after that, making a GaP substrate 200 (n=3.5) adhere to the semiconductor layer, and is formed so as to be in square form with a width $W_1$ of 300 μm. LED element 2 is formed so as to have a thickness $H_1$ of 100 μm by polishing GaP substrate 200. The surface on the side from which light is taken out has portion in uneven form 20A.

As shown in FIG. 7C, portion in uneven form 20A is formed by providing protrusions 20A ($w_1$=50 μm, $h_1$=25 μm) and flat portions 20b ($w_2$=50 μm) on the surface on the side from which light is taken out through cutting by a dicer, and after that, providing microscopic flatness on the surface through chemical etching Effects of the Fifth Embodiment According to the fifth embodiment, GaP substrate 200 is polished to a desired thickness on the side from which light is taken out, and in addition, portion in uneven form 20A is provided through cutting by a dicer, and thereby, LED element 2 having excellent properties of taking out light is gained. In addition, at this time, the light emitting layer can be prevented from being damaged during processing on the side of GaP substrate 200. In the case of a GaP substrate 200 of n=3.5, a sealing material of approximately n=2.4 is used to make it possible for light that has been emitted from an end portion of LED element 2 to be radiated to the outside of LED element 2 without total reflection of light that laterally propagates when entering into portion in uneven form 20A when portion in uneven form 20A is formed so as to have the above described size. It is difficult in practice to implement a sealing material for LED element 2 that exceeds n=2, which is the current level. Even in the case where radiation of light to the outside cannot be implemented at an ideal level, however, light can be made to radiate from the uneven side in approximately vertical step form to the outside at a solid angle in a large angular range that covers the direction from 90°−sin$^{-1}$(n1/n2) to 90° (here, n1 is the refractive index of the light emitting layer of LED element 2, and n2 is the refractive index of the sealing material) relative to the direction of the normal line of the light emitting layer. In particular, this form and a sealing material of n=1.6 or greater are combined, and thereby, a gain that is much higher than that in the case where the form is not processed and an epoxy resin sealing of n=1.5 is used can be gained.

Here, tapers (inclined angles) with the limit of the critical angle between the light emitting layer and the sealing material of the LED element may be formed in the uneven step portions. Within this limit, an effective uneven side in step form can be provided. That is to say, the inclinations are provided so as to make light radiate to the outside in the direction 90° relative to the direction of the normal of the light emitting layer, which makes the solid angle maximum. In addition, the LED element may be formed by combining a light emitting layer of LED element 2 and a substrate having the same refractive index as the light emitting element, for example, a GaN substrate and a GaN based semiconductor layer, or an SiC substrate and a GaN based semiconductor layer, instead of the layered structure which is formed of GaP substrate 200 and AlInGaP based semiconductor layer 201.

Sixth Embodiment (Configuration of LED Element 2)

Figure 8A:
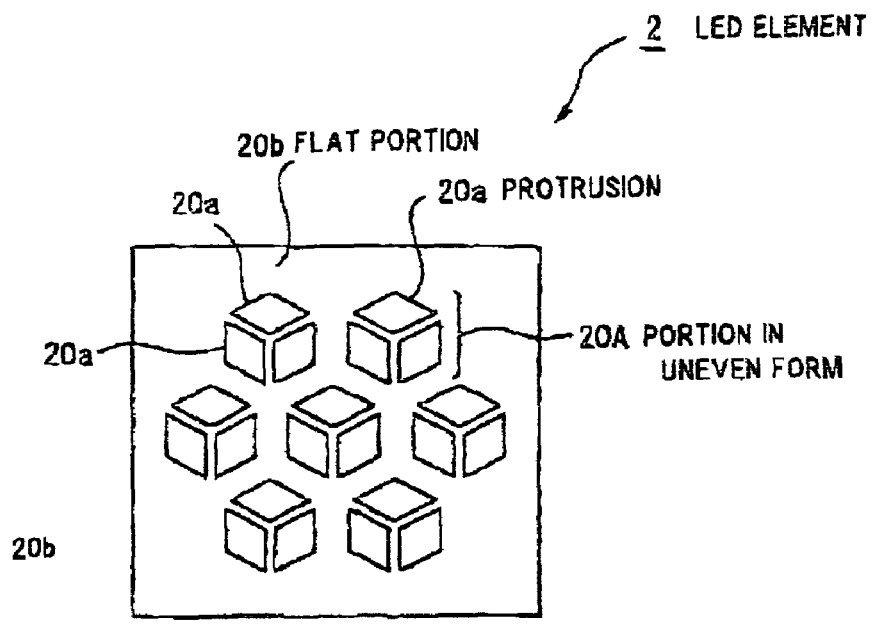
FIGS. 8A and 8B show an LED element according to a sixth embodiment.
Figure 8B:
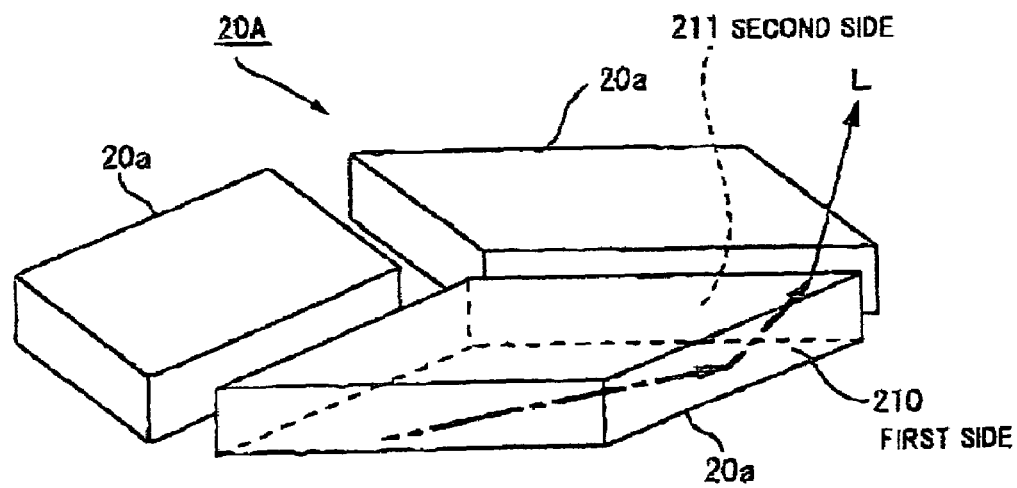

FIGS. 8A and 8B show an LED element according to a sixth embodiment; FIG. BA is a plan view of the LED element as viewed from the side from which light is taken out, and FIG. 8B is a diagram for illustrating how light is taken out in the portion in protrusion form of FIG. 8A. This LED element 2 has portion in uneven form 20A where collective bodies in hexagonal form are arranged in staggered form via flat portions 20b (with intervals of 10 μm), and in each of these collective bodies, three protrusions 20a (having a height of 2 μm) in diamond form (adjacent step sides form 60° or 120°) are combined on the surface of an n-GaN: Si layer from which light is taken out, as shown in FIG. BA.

When light L that has been generated in an MQW (not shown) of LED element 2, not shown, enters into a protrusion 20a, as shown in FIG. 8B, it is totally reflected from a first side 210 so as to enter into a second side 211. Second side 211 forms an acute angle with first side 210, and light L that enters into second side 211 is radiated to the outside when the incident angle becomes smaller than the critical angle θc. This is because protrusion 20a is formed so as to have sides the angle between which is 2 or more times greater than critical angle θc.

Effects of the Sixth Embodiment

According to the sixth embodiment, protrusions 20*a* formed so as to have sides the angle between which is 2 or more times greater than critical angle θc, and therefore, light L that has entered into a protrusion 20*a* can be prevented from becoming light in a mode where it is not radiated to the outside from protrusion 20*a*, and thus, light that is confined within a layer that has entered into the protrusion 20*a* can be radiated to the outside without fail.

In addition, portion in uneven form 20A is formed of the collective bodies of protrusions 20*a*, and therefore, it becomes possible to make light that is confined within a layer efficiently radiate to the outside. Here, though a configuration where seven portions in uneven form 20A are arranged in staggered form is described in the sixth embodiment, the arrangement of protrusions in uneven form 20A is not limited to the configuration shown, but rather, an arbitrary number of portions in uneven form 20A can be provided.

Seventh Embodiment (Configuration of LED Element 2)

Figure 9A:
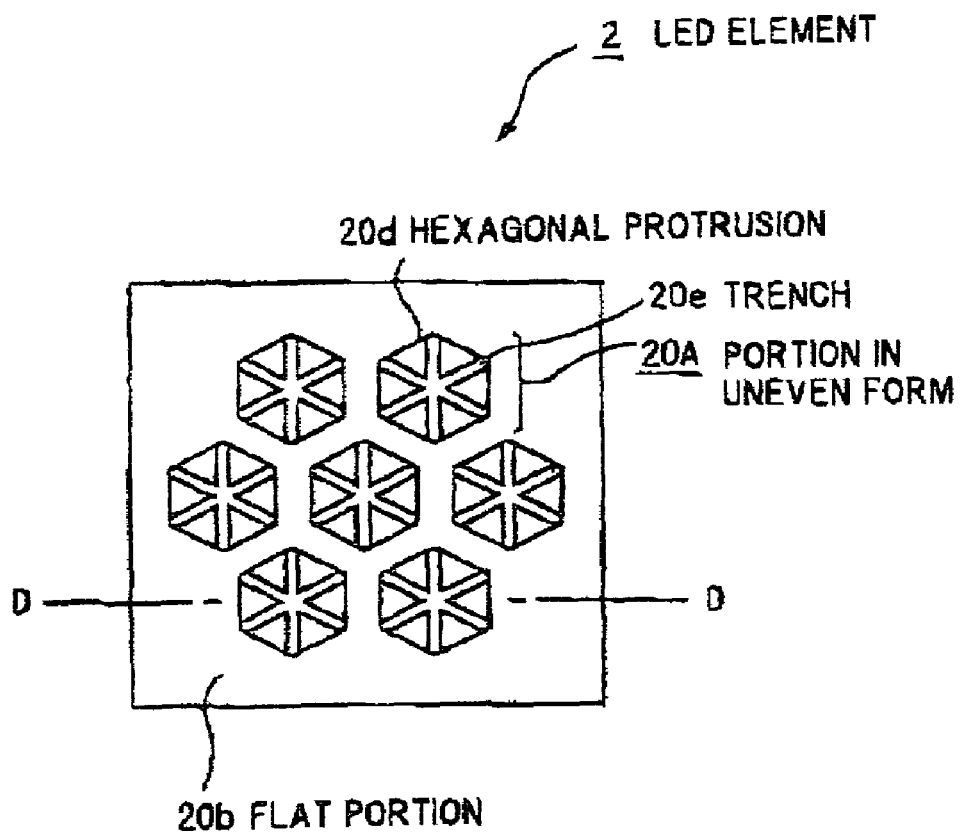
FIGS. 9A and 9B show an LED element according to a seventh embodiment.
Figure 9B:
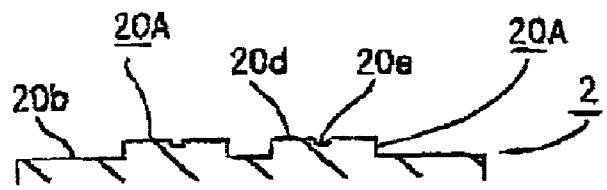

FIGS. 9A and 9B show an LED element according toga seventh embodiment; FIG. 9A is a plan view of the LED element as viewed from the side from which light is taken out, and FIG. 9B is a cross-sectional view along line D-D of FIG. 9A. As shown in FIG. 9A, this LED element 2 has portions in uneven form 20A each of which has a hexagonal protrusion 20*d* with the surfaces from which light is taken out from an n-GaN: Si layer forming an outer hexagonal shape, and trenches 20*e* which are created in the upper surface of this hexagonal protrusion 20*d* so as to cross each other at 60 degrees and these portions in uneven form 20A are arranged in staggered form on flat portion 20*b*.

Effects of the Seventh Embodiment

According to the seventh embodiment, portions in uneven form 20A each of which is made of a hexagonal protrusion 20*d* and trenches 20*e* are provided on the surface of LED element 2 from which light is taken out, and thereby, light that has entered into a hexagonal protrusion 20*d* having a form of which the probability of light entering is high is radiated to the outside from the portion in uneven form with high efficiency, and thus, the efficiency of radiation to the outside of light that is confined within a layer and enters into a side of a hexagonal protrusion 20*a* and a side of a trench 20*e* can be increased.

Eight Embodiment (Configuration of Light Emitting Device 1)

Figure 10:
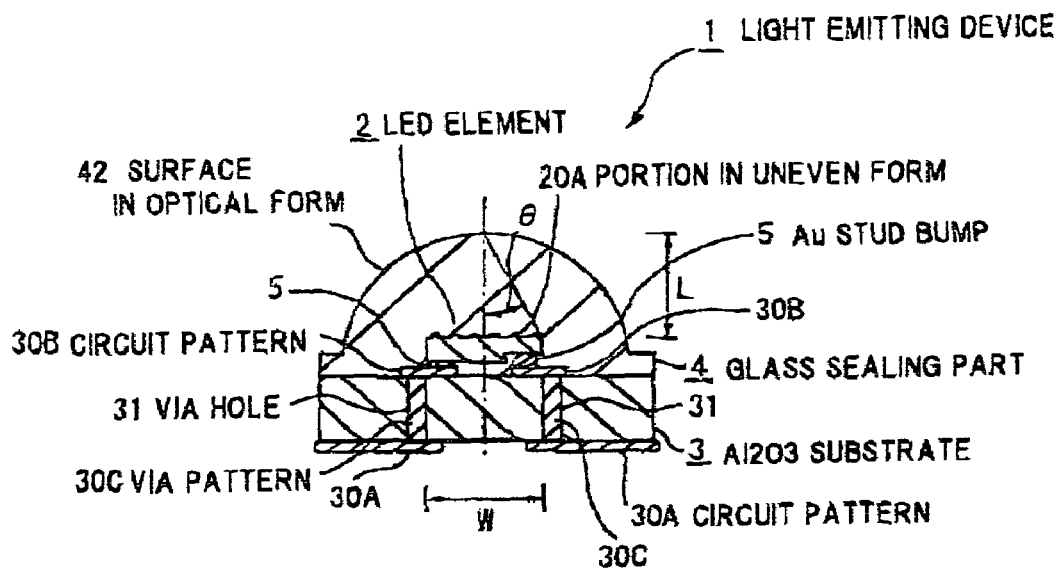
FIG. 10 is a vertical cross-sectional view showing a light emitting device according to an eighth embodiment.

FIG. 10 is a vertical cross-sectional view showing a light emitting device according to an eighth embodiment. This light emitting device 1 is different from that of the first embodiment in that in the eighth embodiment, the glass sealing part 4 of light emitting device 1 has a surface in optical form 42 which is in a hemispherical form. A circuit pattern 30B on which LED element 2 is mounted is connected to a circuit pattern 30A on the bottom, surface of an $Al_2O_3$ substrate 3 through via patterns 30C which are provided in via holes 31. In addition, the refractive index n of glass sealing part 4 shown in this diagram is 1.9, and LED element 2 is formed in square form with W=300 μm.

When glass sealing part 4 in hemispherical form is provided, surface in optical form 42 around LED element 2 is ideally in an optical form into which light that is radiated from LED element 2 can perpendicularly enter. Here, critical angle θ of surface in optical form 42 becomes $\theta = \sin^{-1}(n0/n2) = 31.8°$, where the refractive index of air is n0=1.0 and the refractive index of glass sealing part 4 is n2=1.9, and the reflectance from the interface tends to increase in the vicinity of −5°, which is critical angle θ, though total reflection does not occur to light that enters at an angle that is within the limit of this critical angle θ, and it is preferable to provide an optical form that allows the amount of light that enters at an angle in a range that makes the reflectance from the interface small to increase.

Effects of the Eighth Embodiment

According to the eighth embodiment, the relationship $\theta = \tan^{-1}(W/2L)$ is gained between radius (height) L of which the origin is LED element 2, the width of the element W and critical angle θ relative to surface in optical form 42, and thereby, in the eighth embodiment, the effects of the reflection from the interface on the efficiency of taking out of light can be suppressed by adjusting the size of the above described LED element 2 and critical angle θ when radius L is no smaller than 0.24 mm. As described above, glass sealing part 4 is provided so that surface in optical form 42 which is in a hemispherical form is provided with a radius that is no smaller than L, and thereby, light emitting device 1 where the reflection from the interface is suppressed and properties of taking out light are excellent can be gained.

In addition, reflection from the interface can be suppressed by increasing L in a form where surfaces C are rounded so as to provide no corner edges, such as in a rectangular parallelepiped form, even though this form is different from a hemispherical form.

Ninth Embodiment (Configuration of LED Element 2)

Figure 11:
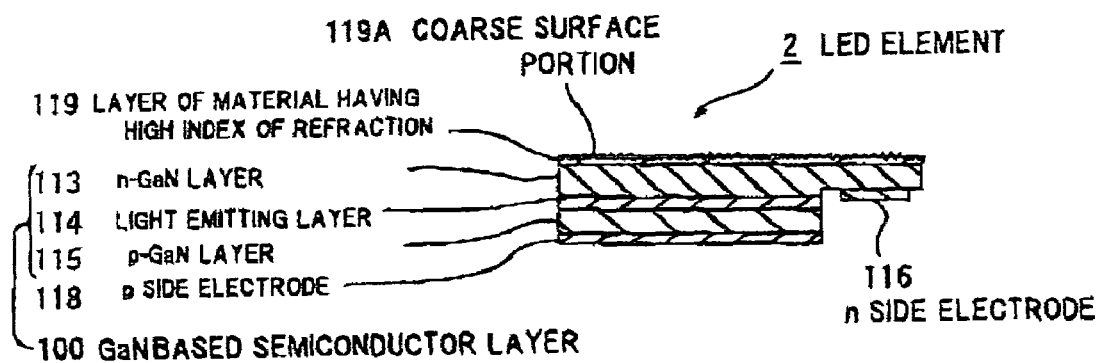
FIG. 11 is a vertical cross-sectional view showing a flip chip type LED element according to a ninth embodiment.

FIG. 11 is a vertical cross-sectional view showing a flip chip type LED element according to a ninth embodiment.

This LED element 2 has an n-GaN layer 113 which is formed of a GaN semiconductor compound, a light emitting layer 114 which is layered on n-GaN layer 113, a p-GaN layer 115 which is layered on light emitting layer 114, an n side electrode 116 which is provided on n-GaN layer 113 that is exposed by removing a portion ranging from p-GaN layer 115 to n-GaN layer 113 through etching, and a p side electrode 118 which is provided on p-GaN layer 115 and is different from that of the first embodiment in that according to the ninth embodiment, the light transmitting layer of a material having a high refractive index 119 made of tantalum oxide ($Ta_2O_5$) is provided instead of portion in uneven form 20A of LED element 2 that is described in the first embodiment, on the side of n-GaN layer 113 from which light is taken out.

The layer of a material having a high refractive index 119 is formed on the surface of n-GaN layer 113 so as to have a film thickness of 1 μm, by heating and vaporizing $Ta_2O_5$, which is a raw material by means of an electron beam vapor deposition method. $Ta_2O_5$ has an refractive index of n=2.2, and critical angle θc becomes 66° on the basis of the ratio of indices of refraction relative to n-GaN layer 113. In addition, a coarse surface portion 119A is formed on the surface of layer of a material having a high refractive index 119 on the side from which light is taken out, in accordance with an electron beam deposition method.

Effects of the Ninth Embodiment

According to the ninth embodiment, layer of a material having a high refractive index 119 made of $Ta_2O_5$ of n=2.2 is provided on the surface of n-GaN layer 113, and thereby, expansion in a solid angle can be achieved. In addition, coarse surface portion 119a is formed when $Ta_2O_5$ re-crystallizes on the surface of n-GaN layer 113 at the time of the film formation of $Ta_2O_5$, and therefore, light diffusing properties in the interface between LED element 2 and the outside can be provided, and the efficiency of taking out light can be increased.

Here, the above described layer of a material having a high refractive index 119 may be formed of a material other than $Ta_2O_5$, and may be, for example, ZnS (n=2.4), SiC (n=2.4), $HfO_2$ (n=2.0), ITO (n=2.0), GaN (n=2.4), $TiO_2$, ZnO, SiC or the like. These materials for film formation need not be conductive materials, and may be any materials having high adhesiveness and excellent optical properties.

Tenth Embodiment (Configuration of LED Element 2)

Figure 12:
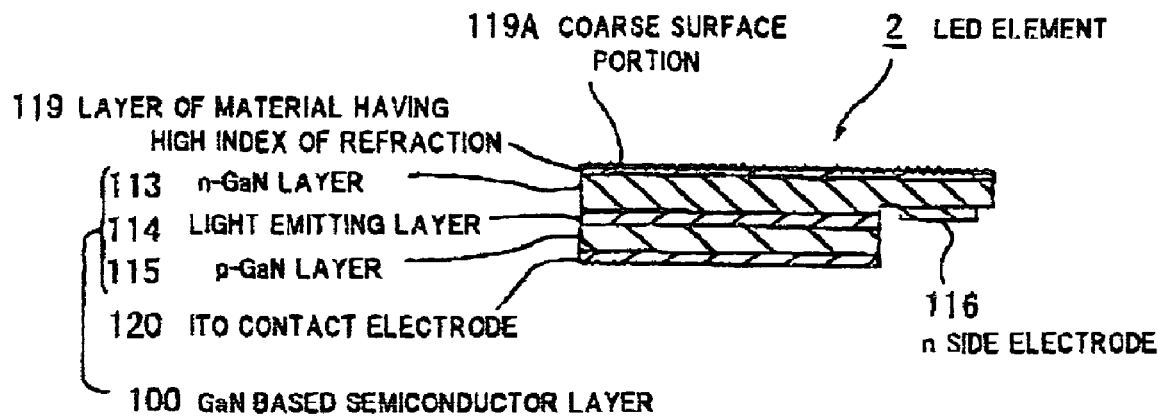
FIG. 12 is a vertical cross-sectional view showing a flip chip type LED element according to a tenth embodiment.

FIG. 12 is a vertical cross-sectional view showing a flip chip type LED element according to a tenth embodiment.

This flip chip type LED element 2 has a configuration where an ITO contact electrode 120 of which the thermal expansion coefficient is $7.0 \times 10^{-6}/°C$. is provided instead of p side electrode 118 of LED element 1 that is described in the ninth embodiment.

Effects of the Tenth Embodiment

According to the tenth embodiment, ITO contact electrode 120 having a thermal expansion coefficient which is approximately the same as that of GaN based semiconductor layer 100 is provided, and therefore, a highly reliable LED element 2 is gained, where, in addition to the preferable effects of the ninth embodiment, the adhesiveness of the p side electrode is increased, so that the p side electrode does not peel as a result of heat created by the sealing processing of LED element 2 or heat that is emitted together with light emission. In addition, unevenness in light emission can be reduced due to the current diffusing properties of ITO. Here, the p side electrode may be formed of a conductive oxide material other than ITO.

Eleventh Embodiment (Configuration of LED Element 2)

Figure 13:
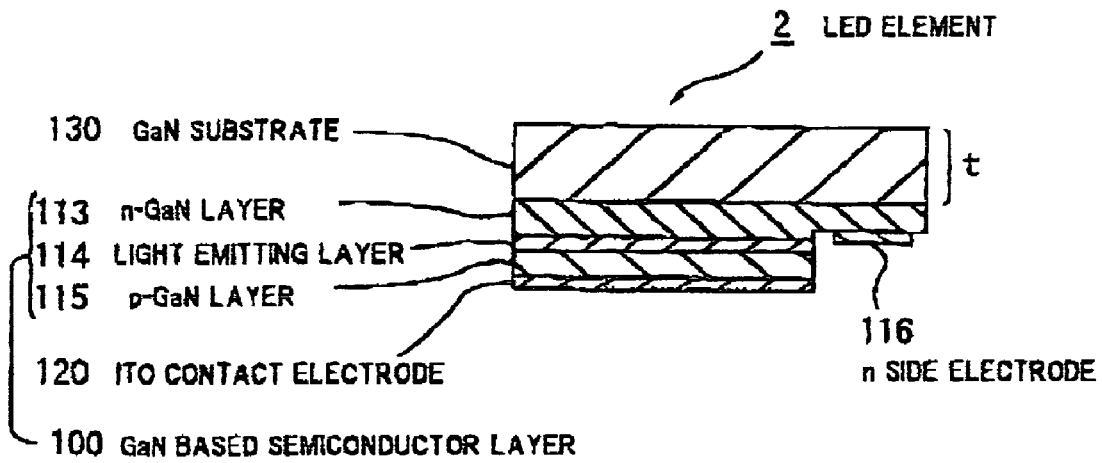
FIG. 13 is a vertical cross-sectional view showing a flip chip type LED element according to an eleventh embodiment.

FIG. 13 is a vertical cross-sectional view showing a flip chip type LED element according to an eleventh embodiment.

This flip chip type LED element 2 is gained by growing a GaN based semiconductor layer 100 on a GaN substrate 130, which is a square having sides of 340 μm and a thickness of 100 μm.

Effects of the Eleventh Embodiment

According to the eleventh embodiment, the relationship $t \geq W/(2\tan(\sin^{-1}(n2/n3)))$ is gained between the thickness (thickness of the sides) t of GaN substrate 130, size W of LED element 2, refractive index n2 of glass sealing part 4, and refractive index n3 of LED element 2, so that all of light that is radiated from GaN based semiconductor layer 100 to GaN substrate 130 does not totally reflect from the interface between GaN substrate 130 and glass sealing part 4, and therefore, in the case where GaN substrate 130 is used in light emitting device 1 shown in FIG. 10, where, for example, W=300 μm, n2=1.9, n2=2.4, the properties of taking out light from LED element 2 can be increased to the ideal efficiency, by making the thickness of GaN substrate 130 $t \geq 116$ μm. Here, it has been confirmed that the properties of taking out light increase even when thickness t has a value of approximately half of the upper limit. In such a case, GaN substrate 130 in rectangular parallelepiped form is in optical form, so as to avoid optical loss in GaN based semiconductor layer 100 having a high ratio of light absorption and make an increase in the efficiency of taking out light from the inside of the element possible.

Figure 16:
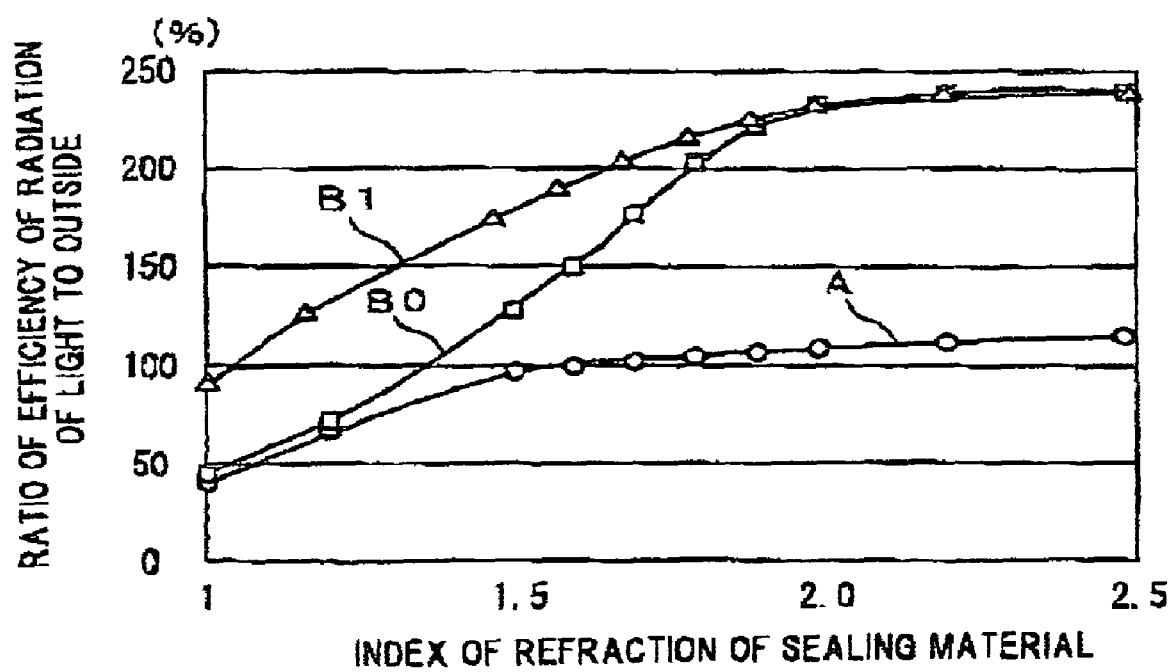
FIG. 16 is a graph showing curves indicating the relationship between the refractve index of the sealing material and the ratio of efficiency of radiation of light to the outside of the LED element

FIG. 16 shows simulation results showing the dependency of the ratio of efficiency of radiation to the outside of a standard LED element on the refractive index of the sealing material. The simulation results were gained using models in predetermined forms having physical values of indices of refraction, transmittances, distances of light attenuation for the epitaxial layers, the substrate layer and the sealing material, respectively, so as to generate 1 million light beams by means of a light beam tracking method. Here, the indices of refraction indicate values for the wavelengths of light that is emitted by the light emitting element. The reference value of the rate of efficiency of radiation to the outside is gained for an element where a sapphire substrate is used as the substrate, and the element is sealed with a sealing material having an refractive index of 1.58.

In FIG. 16, curve A shows the ratio of efficiency of radiation to the outside of an LED element (standard element) in rectangular parallelepiped form using a sapphire substrate, curve B0 shows the ratio of efficiency of radiation to the outside of an LEE element in rectangular parallelepiped form using a substrate which is GaN or has an refractive index that is the same as that of GaN, and curve B1 shows the ratio of efficiency of radiation to the outside of an LED element in rectangular parallelepiped form using a substrate which is GaN or has an refractive index that is the same as that of GaN, and on which surface processing has been carried out The dimensions of all of the rectangular parallelepiped forms are W=300 μm, the thickness of semiconductor layer t=6 μm, and the thickness of substrate is 84 μm (thickness of 72% of 116 μm) This is a case where the processed form on the surface is a prism having an inclination angle of 45° (with bottom sides of 2 μm). Here, the characteristics curves do not change greatly, and stay approximately the same, even in the case where the inclination angle is changed within a range of ±15°. This is because it becomes easier for light to be radiated from the light emitting element to the sealing material while it also becomes easier for light to reenter into the adjacent surface in processed form as the angle of inclination is increases.

In the case where the refractive index of the sealing material is no smaller than 1.6, a great increase in efficiency of no less than 80% relative to the reference value can be gained. It is more desirable for the refractive index of the sealing material to be no smaller than 1.7 and no greater than 2.1. In the case where the refractive index is no less than 1.7, the efficiency of radiation to the outside from the LED element to the sealing material can be brought approximately to the ideal level. On the other hand, in the case where the refractive index of the sealing material is too high, this causes a reduction in the efficiency of radiation from the sealing material into the air. That is to say, restriction in the form where total reflection does not occur becomes too great, and the reflectance from the interface becomes great when light incidents perpendicular to the interface. Therefore, it is desirable for the ratio of the refractive index of the sealing material to the refractive index of the light emitting layer of the LED to be in a range from 0.68 to 0.85.

Here, though in the eleventh embodiment, a configuration where GaN based semiconductor layer 100 is provided to GaN substrate 130 is described, an LED element 2 may be provided, where, for example, a GaN based semiconductor layer 100 is provided on an SiC substrate. In addition, a sapphire substrate may be removed by means of laser lift-off after GaN based semiconductor layer 100 has been grown on the sapphire substrate, and GaN substrate 130 may be made to adhere to the semiconductor layer as the layer of a material having a high refractive index.

At this time, there are no restrictions for epitaxial growth in the layer of a material having a high refractive index, it is not necessary for the lattice constant to be the same as that of the epitaxial growth layer, and it is also not necessary for the epitaxial layer to be of single crystal. It is enough for the epitaxial growth layer to have only light transmitting properties for an optical member, a satisfactory refractive index and thermal expansion coefficient for making a connection. Therefore, the epitaxial growth layer may be $TiO_2$, $Ga_2O_3$, ZnO or the like, in addition to GaN, or may be a polycrystal body of any of these.

Twelfth Embodiment (Configuration of LED Element 2)

Figure 14:
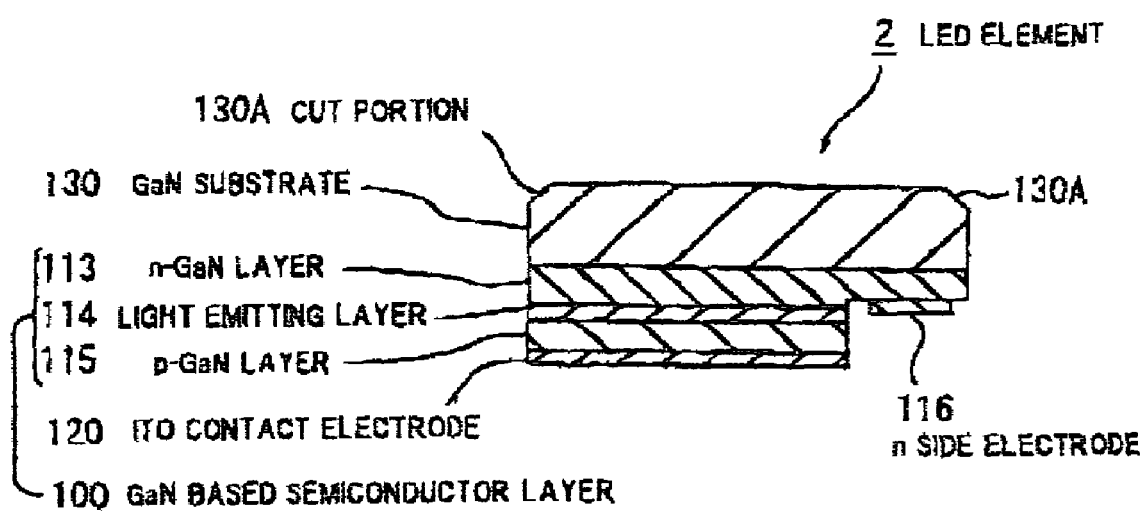
FIG. 14 is a vertical cross-sectional view showing a flip chip type LED element according to a twelfth embodiment.

FIG. 14 is a vertical cross-sectional view showing a flip chip type LED element according to a twelfth embodiment.

This flip chip type LED element 2 is gained by providing cut portions 130A having an inclination angle of 45° in the corners of GaN substrate 130 (in the form where surfaces C are rounded in the corners of the substrate) of LED element 2 of the eleventh embodiment.

Effects of the Twelfth Embodiment

Figure 15A:
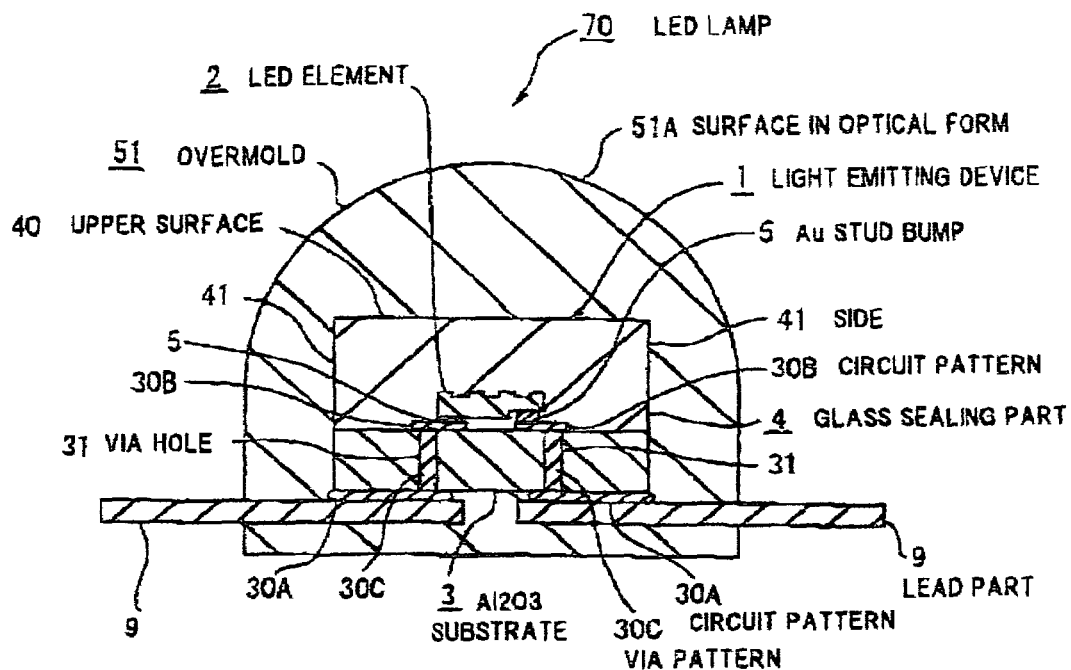
FIGS. 15A and 15B show an LED lamp according to a thirteenth embodiment.
Figure 15B:
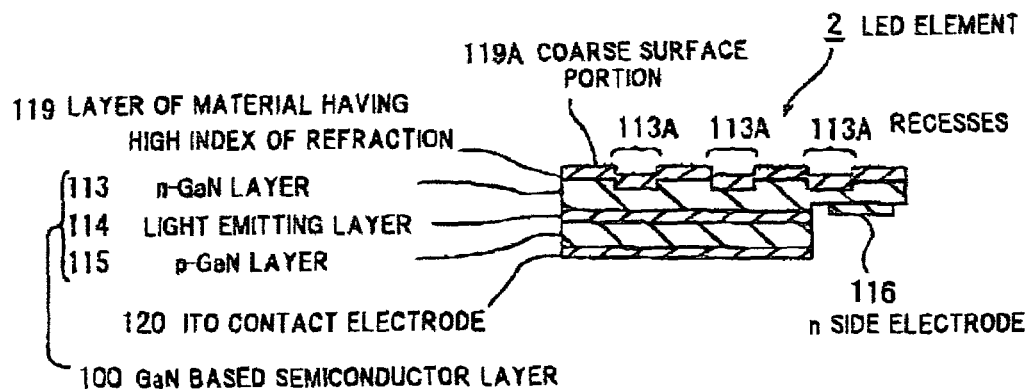

According to the twelfth embodiment, an efficiency of radiation to the outside that is the same as curve B1 of FIG. 16, which shows a preferable effect of the eleventh embodiment, can be gained, and light that laterally propagates through LED element 2 can be taken out with high efficiency to a medium having a low refractive index. Furthermore, a form of the element can be provided where all of light that is radiated from GaN based semiconductor layer 100 to GaN substrate 130 is not totally reflected from the interface between GaN substrate 130 and glass sealing part 4, even when the thickness of GaN substrate 130 is no greater than 116 μm. In addition, processing in the surface form can be made easy It becomes possible to gain a ratio of efficiency of radiation to the outside of 200% by carrying out such processing in the surface form, even in the case where the element is sealed with a sealing material of, for example, n=1.7. A material having a high refractive index of n=1.9 or higher has properties such that absorption loss tends to increase in the region of short wavelengths, whereas an increase in the efficiency of radiation to the outside can be achieved with a sealing material of approximately n=1-7, and therefore, it becomes easy to apply the invention to LED elements that emit ultraviolet light of which the wavelength is in the vicinity of 370 nm, in addition to blue, bluish green and the like Thirteenth Embodiment FIGS. 15A and 15B show an LED lamp according to a thirteenth embodiment; FIG. 15A is a vertical cross-sectional view of the LED lamp, and FIG. 15B is a vertical cross-sectional view of the LED element that is mounted on the LED lamp.

This LED lamp 70 is gained by mounting a light emitting device 1 where LED element 2 that is shown in FIG. 15B is sealed with a glass sealing part 4 on lead parts 9, and furthermore, integrating these in an overmold 51 made of a light transmitting resin. The overmold 51 has a surface in optical form 51A which is in a hemispherical form, so that light can be radiated with high efficiency from light emitting device 1 to the outside.

In LED element 2, recesses 113A in trench form having a predetermined width and depth are aligned in grid form on the surface of n-GaN layer 113 from which light is taken out, and a layer of a material having a high refractive index 119 made of $Ta_2O_5$ is provided on this surface. Coarse surface portion 119A is formed on the surface of layer of a material having a high refractive index 119 by means of an electron beam vapor deposition method.

Effects of the Thirteenth Embodiment

According to the thirteenth embodiment, recesses 13A in trench form are aligned in grid form, and LED element 2, which has layer of a material having a high refractive index 119, is provided on the surface thereof, and thereby, the area of LED element 2 from which light is taken out is expanded, and the surface from which light is taken out includes horizontal surfaces and vertical surfaces, and thereby, the efficiency of taking out light is enhanced. Furthermore, layer of a material having a high refractive index 119 having coarse surface portion 119A is provided on the surface of n-GaN layer 113, and therefore, light confined within and propagating through n-GaN layer 113 can be radiated to the outside from a recess 113A in trench form before it reaches a side, and the critical angle at this time can be widened by layer of a material having a high refractive index 119. Therefore, light emitting device 1 having high brightness can be gained.

In addition, light emitting device 1 is formed by sealing LED element 2 in glass, and therefore, has excellent mechanical strength, such that sealing processing by means of injection molding becomes possible, and the overmold 51 can be easily formed around light emitting device 1, and thus, the productivity of LED lamp 70 is excellent.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A light emitting device, comprising:
a predetermined optical form that is provided on a surface of an LED element mounted on a base, the predetermined optical form being made to allow an increase in efficiency of taken out light from an inside of the LED element; and
a sealing material that seals the LED element, wherein
the sealing material has a refractive index of 1.6 or more,
the predetermined optical form is formed to comprise a combination of uneven forms having different forms and different depths in a semiconductive surface of a substrate of the LED element,
the substrate has a refractive index nearly equal to that of a light emitting layer of the LED element,
the LED element is flip mounted on the base, the sealing material comprises an $SiO_2$—$Nb_2O_5$ based glass as a matrix material, and the sealing material directly contacts the predetermined optical form.

2. The light emitting device according to claim 1, wherein: the predetermined optical form comprises a light transmitting material layer having a refractive index that is no less than the average of that of the light emitting layer and the sealing material of the LED element.

3. The light emitting device according to claim 1, wherein: the predetermined optical form is formed in a light transmitting material layer which is provided to a semiconductor layer that is exposed by peeling the substrate of the LED element, and has the same refractive index as that of the light emitting layer of the LED element.

4. ) The light emitting device according to claim 1, wherein:

the predetermined optical form comprises an uneven surface having a portion in step form of which the angle of inclination is no greater than $\sin^{-1}$ (n2/n1) (where n1 is the refractive index of the light emitting layer of the LED element, and n2 is the index refraction of the sealing material) relative to the direction of the normal of the light emitting layer.

5. The light emitting device according to claim 1, wherein: a number of conical surfaces are formed in the predetermined optical form.

6. The light emitting device according to claim 1, wherein: the outer form of the sealing material is formed in an optical surface form where light that is emitted from the LED element enters at an angle that is different from the critical angle, defined by the ratio of the indices of refraction relative to the sealing material.

7. The light emitting device according to claim 1, wherein: the sealing material comprises a light transmitting material of which the refractive index satisfies $n1 \cdot \sin 45° < n2$ (where n1 is the refractive index of the light emitting layer of the LED element, and n2 is the refractive index of the sealing material).

8. The light emitting device according to claim 1, wherein: the base comprises an inorganic material substrate having the same thermal expansion coefficient as the sealing material, where a conductive pattern for supplying power to the light emitting element is formed.

9. The light emitting device according to claim 1, wherein: the LED element comprises a GaN based semiconductor.

10. The light emitting element according to claim 1, further comprising:

a p-electrode formed of ITO (indium tin oxide).

11. The light emitting device according to claim 2, wherein:

in the predetermined optical form, the light transmitting material layer is formed so as to have a thickness t, in such a manner that $t > W/(2\tan(\sin^{-1}(n1/n2)))$ where W is the width of the element.

12. The light emitting device according to claim 2, wherein:

the light transmitting material layer has a cut portion where a corner has been cut so as to provide an inclined surface.

13. The light emitting device according to claim 2, wherein: the refractive index of the sealing material ranges from 0.68 to 0.85 relative to the refractive index of the light emitting layer.

14. The light emitting device according to claim 4, wherein:

the predetermined optical form comprises an uneven surface having an approximately perpendicular step form.

15. The light emitting device according to claim 4, wherein:

the uneven surface comprises a form where a trench is formed around an uneven portion.

16. The light emitting device according to claim 4, wherein:

the portion in step form has a form where sides which are adjacent to each other make contact with each other at different angles.

17. The light emitting device according to claim 16, wherein:

the portion in step form is formed in diamond form.

18. The light emitting device according to claim 8, wherein:

the conductive pattern has a pattern on the side on which the light emitting element is mounted, a pattern on the rear side thereof, and a pattern for electrically connecting the two sides.

19. The light emitting device according to claim 9, wherein: the sealing material has a refractive index of no less than 1.7.

20. A light emitting device, comprising:

a predetermined optical form that is provided on a surface of an LED element mounted on a base, the predetermined optical form being made to allow an increase in efficiency of taken out light from an inside of the LED element; and a sealing material that seals the LED element, wherein the sealing material has a refractive index of 1.6 or more, the predetermined optical form is formed to comprise a combination of uneven forms having different forms and different depths in a surface of a semiconductor layer that is exposed by peeling a substrate and comprises a surface of the LED element, the LED element is flip mounted on the base, the sealing material comprises glass an $SiO_2$—$Nb_2O_5$ based glass as a matrix material, and the sealing material directly contacts the predetermined optical form.

21. The light emitting device according to claim 20, wherein:

the predetermined optical form comprises a light transmitting material layer having a refractive index that is no less than the average of that of the light emitting layer and the sealing material of the LED element.

22. The light emitting device according to claim 20, wherein:

the predetermined optical form comprises an uneven surface having a portion in step form of which the angle of inclination is no greater than $\sin^{-1}$ (n2/n1) (where n1 is the refractive index of the light emitting layer of the LED element, and n2 is the index refraction of the sealing material) relative to the direction of the normal of the light emitting layer.

23. The light emitting device according to claim 20, wherein:

the outer form of the sealing material is formed in an optical surface form where light that is emitted from the LED element enters at an angle that is different from the critical angle, defined by the ratio of the indices of refraction relative to the sealing material.

24. The light emitting device according to claim 20, wherein:
the sealing material comprises a light transmitting material of which the refractive index satisfies $$n1 \cdot \sin 45° < n2$$

(where n1 is the refractive index of the light emitting layer of the LED element, and n2 is the refractive index of the sealing material).

25. The light emitting device according to claim 20, wherein:
the LED element comprises a GaN based semiconductor.

26. The light emitting element according to claim 20, further comprising:
a p-electrode formed of ITO (indium tin oxide).

27. A light emitting element, comprising:
a semiconductor layer that comprises a light emitting layer, a predetermined optical form that is provided on one surface of the semiconductor layer, the predetermined optical form being made to allow an increase in efficiency of taken out light from an inside of the light emitting element (LED element);
an electrode part that is provided on the other surface of semiconductor layer; and
a sealing material that seals the LED element, the sealing material comprising an $SiO_2$—$Nb_2O_5$ based glass as a matrix material,
wherein the predetermined optical form is an uneven surface comprising a rectangular projection of different forms and different depths in a vertical cross section of the semiconductor layer.

28. The light emitting element according to claim 27, wherein:
the predetermined optical form is formed in a surface of a substrate of the LED element, and
the substrate has a refractive index nearly equal to that of the light emitting layer of the LED element.

29. The light emitting element according to claim 27, wherein:
the predetermined optical form is formed in a surface of a semiconductor layer that is exposed by peeling a substrate of the LED element.

30. The light emitting element according to claim 27, wherein:
the rectangular projection comprises sides which are adjacent to each other at different angles in said one surface of the semiconductor layer.

31. The light emitting element according to claim 27, wherein:
the LED element comprises a GaN based semiconductor.

32. The light emitting element according to claim 27, wherein:
the electrode part comprises a p-electrode formed of ITO (indium tin oxide).

33. The light emitting element according to claim 29, wherein:
the rectangular projection comprises a diamond form in said one surface of the semiconductor layer.

34. A light emitting element, comprising:
a semiconductor layer that comprises a light emitting layer, a predetermined optical form that is provided on one surface of the semiconductor layer, the predetermined optical form being made to allow an increase in efficiency of taken out light from an inside of the light emitting element (LED element);
an electrode part that is provided on the other surface of semiconductor layer;
a light transmitting material layer that is provided on one surface of the semiconductor layer; and
a sealing material that seals the LED element, the sealing material comprising an $SiO_2$—$Nb_2O_5$ based glass as a matrix material.
wherein the predetermined optical form is formed in a surface of the light transmitting material layer, and
the light transmitting material layer comprises GaN,
wherein the predetermined optical form is an uneven surface comprising a rectangular projection of different forms and different depths in a vertical cross section of the light transmitting material layer.

35. The light emitting element according to claim 34, wherein:
the electrode part comprises a p-electrode for med of ITO (indium tin oxide).

* * * * *